United States Patent
Sonoda et al.

(10) Patent No.: US 7,157,751 B2
(45) Date of Patent: Jan. 2, 2007

(54) DISPLAY DEVICE

(75) Inventors: Daisuke Sonoda, Mobara (JP); Toshiki Kaneko, Chiba (JP)

(73) Assignee: Hitachi Displays, Ltd., Mobara (JP)

( * ) Notice: Subject to any disclaimer, the term of this patent is extended or adjusted under 35 U.S.C. 154(b) by 0 days.

(21) Appl. No.: 10/392,862

(22) Filed: Mar. 21, 2003

(65) Prior Publication Data

US 2003/0178650 A1    Sep. 25, 2003

(30) Foreign Application Priority Data

Mar. 22, 2002 (JP) ............................. 2002-080166

(51) Int. Cl.
*H01L 29/72* (2006.01)
(52) U.S. Cl. .................. 257/204; 257/368; 257/369; 257/391; 257/392; 257/407
(58) Field of Classification Search ............... 257/204, 257/368, 407, 369, 391, 392
See application file for complete search history.

(56) References Cited

U.S. PATENT DOCUMENTS 4,962,413 A * 10/1990 Yamazaki et al. ........... 257/369
5,747,854 A * 5/1998 Gotou ......................... 257/368
6,255,695 B1 * 7/2001 Kubota et al. ............... 257/351
6,639,575 B1 10/2003 Tsunashima et al.
2002/0190346 A1 * 12/2002 Wong et al. ................. 257/511
2003/0054613 A1 * 3/2003 Murakami et al. .......... 438/287

FOREIGN PATENT DOCUMENTS

JP        09-064295        3/1997

* cited by examiner

*Primary Examiner*—Edward Wojciechowicz
(74) *Attorney, Agent, or Firm*—Antonelli, Terry, Stout and Kraus, LLP.

(57) ABSTRACT

The present invention realizes a display device having C-MOS p-Si TFTs which enable the high integration by reducing spaces for P-MOS TFTs and N-MOS TFTs in driving circuit or the like thereof. The present invention adopts a self-aligned C-MOS process which uses a half tone mask as an exposure mask for manufacturing the C-MOS p-Si TFTs mounted on the display device. With the use of the half tone mask, the alignment or positioning at a bonding portion between a P-MOS portion and an N-MOS portion becomes unnecessary and hence, the number of photolithography steps can be reduced and the high integration of C-MOS TFT circuits can be realized.

17 Claims, 8 Drawing Sheets

DISPLAY DEVICE

BACKGROUND OF THE INVENTION

The present invention relates to a display device; and, more particularly, the invention relates to a display device in which C-MOS thin film transistors, which are highly integrated using a small number of manufacturing steps, are provided as active elements on a display region, or in a driving circuit for controlling the display region.

There has been a tendency in the design and production of a flat-panel type display device, which uses liquid crystal or organic EL, to employ polysilicon thin film transistors (p-Si TFT), which are advantageous for high definition and fast operation, as driving circuits or active elements. In a display device which uses these low-temperature polysilicon thin film transistors, by directly building driving circuits in the periphery of a substrate of the display device, it is possible to reduce the number of external connection terminals, so that the manufacturing cost thereof can be reduced.

SUMMARY OF THE INVENTION

The p-Si TFT used in the shift register of the driving circuit of a display device particularly adopts a C-MOS constitution in view of the demand for low power consumption and fast operation. To manufacture such a highly integrated C-MOS p-Si, it is necessary to perform a photolithography method or a photolithography step (a patterning method or a process using an exposure mask and etching, hereinafter referred to as a "photo step") many times, and this greatly increases the manufacturing cost of the whole display device. Further, these polysilicon thin film transistors are also used in active elements for selecting pixels simultaneously.

The C-MOS p-Si TFT (hereinafter also referred to as a "C-MOS TFT") is constituted of a pair of devices consisting of a P-MOS p-Si TFT (hereinafter referred to as a "P-MOS TFT") and a N-MOS p-Si TFT (hereinafter referred to as a "N-MOS TFT"). In manufacturing the C-MOS TFT, although the N-MOS TFT is arranged close to the P-MOS TFT, it is necessary to align the N-MOS TFT with the P-MOS TFT. Recently, the N-MOS TFT has been simply manufactured by adopting a so-called self-aligned LDD process. Using this process, it is possible to manufacture the C-MOS TFT with a small number of photo steps.

FIG. 9 is a top plan view which schematically shows the constitution of one example of a conventional C-MOS TFT that is mounted on a display device. Reference numeral 13 indicates a gate electrode of a P channel portion, reference numeral 13' indicates a gate electrode of an N channel portion, reference numeral 17 indicates contact holes, reference numeral 31 indicates an N$^+$ portion, reference numeral 32 indicates an N$^-$ portion, reference numeral 34 indicates an P$^+$ channel portion, reference numeral 25 indicates a P channel portion, and reference numeral 26 indicates an N channel portion. AC-MOS TFT element circuit is constituted of the P channel portion 25, having the P$^+$ portion 34, and the N channel portion 26, having the N$^+$ portion 31 and the N$^-$ portion 32. The gate electrode 13 of the P channel portion 25 and the gate electrode 13' of the N channel portion 26 have an alignment portion 35 at a portion where both parts are connected to each other.

However, in manufacturing the C-MOS TFT using this process, the space for alignment of the bonding portions of the P-MOS TFT and the N-MOS TFT is extremely enlarged, and, hence, high integration becomes difficult. Accordingly, it is difficult to realize a display device that is capable of high definition and rapid driving.

It is an object of the present invention to realize a display device having a p-Si TFT with a C-MOS constitution in a driving circuit or the like, which can reduce the space for bonding portions of the P-MOS TFT and the N-MOS TFT.

To achieve the above-mentioned object, the present invention realizes high integration of a C-MOS TFT provided in a display device by adopting a self-aligned C-MOS process which uses half exposure masks (half tone masks) as exposure masks for the manufacture of the C-MOS TFT. With the use of half tone masks, the number of photo steps can be reduced, and the alignment of bonding portions of a P-MOS TFT and a N-MOS TFT becomes unnecessary, so that a display device that is capable of high definition and rapid driving can be realized. Typical constitutions among examples of the display device according to the present invention are as follows.

(1) The display device includes a thin film transistor substrate which is provided with C-MOS thin film transistors, in which there is a difference in width between a gate electrode of a P channel portion and a gate electrode of an N channel portion.

(2) The difference in the widths of gate electrodes in the constitution (1) is equal in the width direction of the gate electrode of the P channel portion and the gate electrode of the N channel portion.

(3) In the P channel portion of the constitution (1) or (2), a P$^+$ semiconductor region and an N$^-$ doping region are present.

(4) The concentration of P$^+$ doping atoms in the P$^+$ semiconductor region, which constitutes the P channel portion, is about $10^{15}$ cm$^{-2}$ and the concentration of N$^-$ doping atoms in the N$^-$ doping region is about $10^{13}$ cm$^{-2}$ in the constitution (3).

(5) The P$^+$ semiconductor region in the constitution (1) or (2) includes N$^-$ doping atoms as impurities.

Due to the respective features of the above-mentioned constitutions of the present invention, it is possible to realize a display device having C-MOS TFTs in which it is possible to reduce the spaces for P-MOS TFTs and N-MOS TFTs in the driving circuits or the like thereof.

Here, it is needless to say that the present invention is not limited to the above-mentioned constitutions, and that the constitutions of various embodiments, which will be explained later, and various modifications are conceivable within the scope of the technical concept of the present invention.

DETAILED DESCRIPTION OF THE INVENTION

Preferred embodiments of the present invention will be described in detail in conjunction with the drawings which show these embodiments.

Although the display device of the present invention will be explained only with respect to a thin film transistor substrate, which constitutes a display device of the present invention, when the display device is a liquid crystal display device, the display device is constituted by laminating a counter substrate onto a thin film transistor substrate with liquid crystal material interposed therebetween. Further, when the display device is an organic EL display device, the display device is constituted by applying organic EL layers to pixel electrodes that are selected by the thin film transistor substrate and providing counter electrodes which sandwich the above-mentioned organic EL layer with the pixel electrodes.

Figure 1:
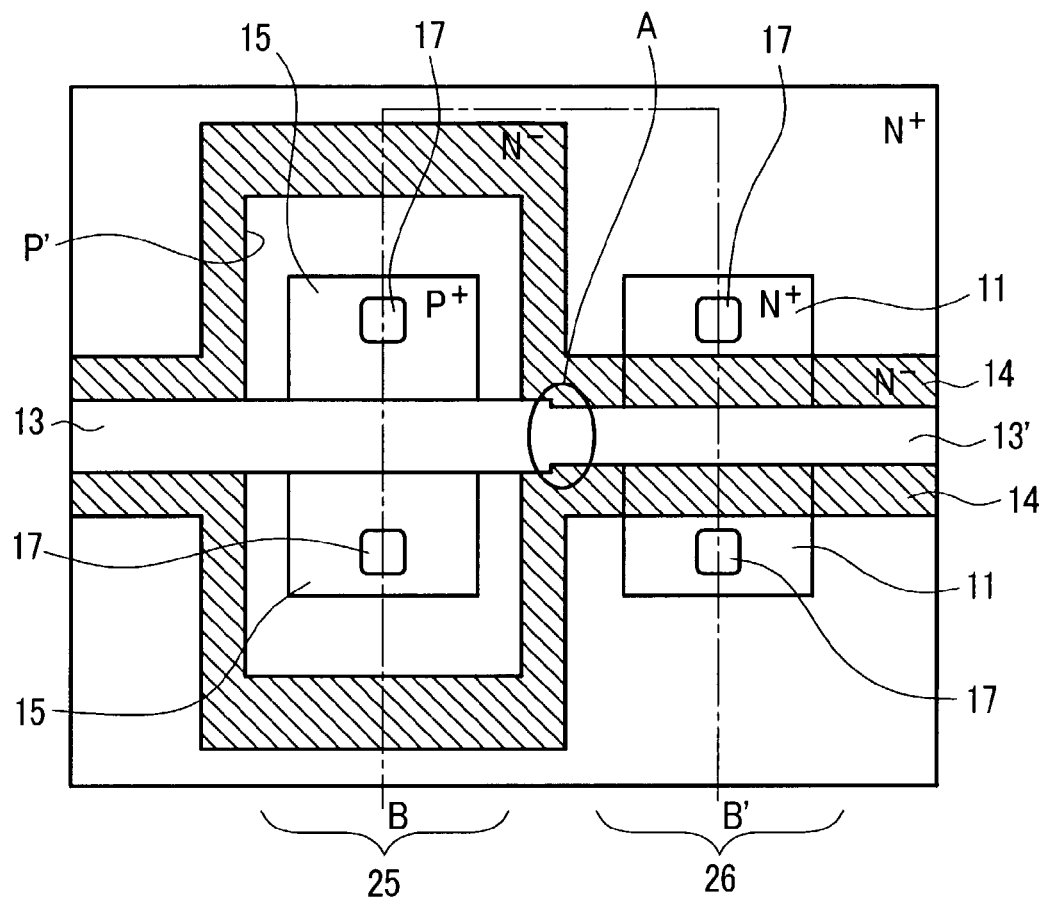
FIG. 1 is a top plan view schematically showing the constitution of a C-OS p-Si TFT element provided in a display device according to the present invention.
Figure 2:
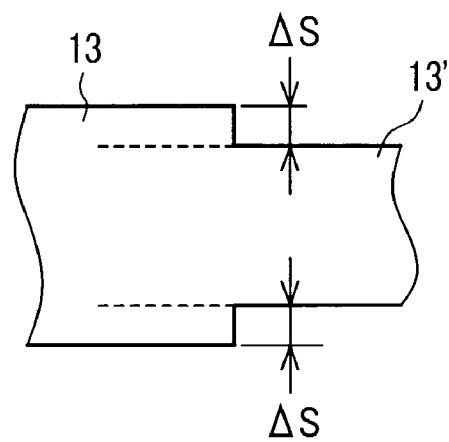
FIG. 2 is an enlarged view of a portion A in FIG. 1.

FIG. 1 is a top plan view schematically showing the constitution of a C-MOS TFT element provided in the display device according to the present invention. Further, FIG. 2 is an enlarged view of a portion A in FIG. 1. Reference numeral 11 indicates an $N^+$ portion, reference numeral 13 indicates a gate electrode of a P channel portion, reference numeral 13' indicates a gate electrode of an N channel portion, reference numeral 14 indicates an $N^-$ portion, reference numeral 15 indicates a $P^+$ portion, reference numeral 17 indicates contact holes, reference numeral 25 indicates a P channel portion, and reference numeral 26 indicates an N channel portion. A C-MOS TFT element circuit is constituted of the P channel portion 25, having the $N^-$ portion 14 and the $P^+$ portion 15, and the N channel portion 26, having the $N^+$ portion 11 and the $N^-$ portion 14. The gate electrode 13 of the P channel portion 25 and the gate electrode 13' of the N channel portion 26 are connected to each other at a connection portion identified as portion A. In this manner, the gate electrode 13 and the gate electrode 13' are arranged on the same straight line. It is needless to say that this straight line shape may curve more or less in manufacturing. However, here, the phrase "on the straight line" in this embodiment means a substantially straight line, as well as a curved straight line shape, which may also achieve an advantageous effect in that high integration can be achieved by reducing the space for the C-MOS TFT. Hence, there arises no problem with respect to such a curved straight line shape.

As shown in an enlarged form in FIG. 2, at the connection portion of the P channel portion 25 and the N channel portion 26, size changes ΔS in width are generated between the gate electrode 13 of the P channel portion 25 and the gate electrode 13' of the N channel portion 26. In this embodiment, the width of the gate electrode of the N channel portion is set to be narrower than the width of the gate electrode of the P channel portion. This is because, when a half exposure mask of the type shown in FIG. 3, which is considered to have the simplest shape, as will be explained later, is used for forming an LDD portion at the N channel portion, the gate width of the P channel portion becomes larger than the gate width of the N channel portion. Accordingly, by changing the half exposure mask, it is possible to set the width of the gate electrode of the N channel portion so that it is larger than the width of gate electrode of the P channel portion. Further, it is theoretically possible to make the gate electrode of the P channel portion and the gate electrode of N channel portion have the same electrode width by finely adjusting the pattern of the half exposure mask. However, it is meaningless to make both electrodes have the same width by performing such a fine adjustment, and so it is not realistic in view of actual manufacturing considerations. Further, this embodiment is also characterized by the fact that the size changes ΔS between the gate electrode of the P channel portion and the gate electrode of the N channel portion are equal on upper and lower sides, as seen in the drawing.

The C-MOS TFT element of this embodiment employs the self-aligned C-MOS process in the manufacture thereof, and, hence, the C-MOS TFT element has no space for alignment at the bonding portions of the P channel portion 25 and the N channel portion 26. Accordingly, the C-MOS TFT element can largely reduce the size of the total space thereof, compared to a C-MOS TFT element having a space for such alignment.

Subsequently, an embodiment of a manufacturing process for the production of a C-MOS TFT in a display device according to this embodiment will be explained. Here, an example of a conventional manufacturing process as used in the production of a C-MOS TFT also will be described hereinafter for explaining the advantageous effects of the present invention.

Figure 3:
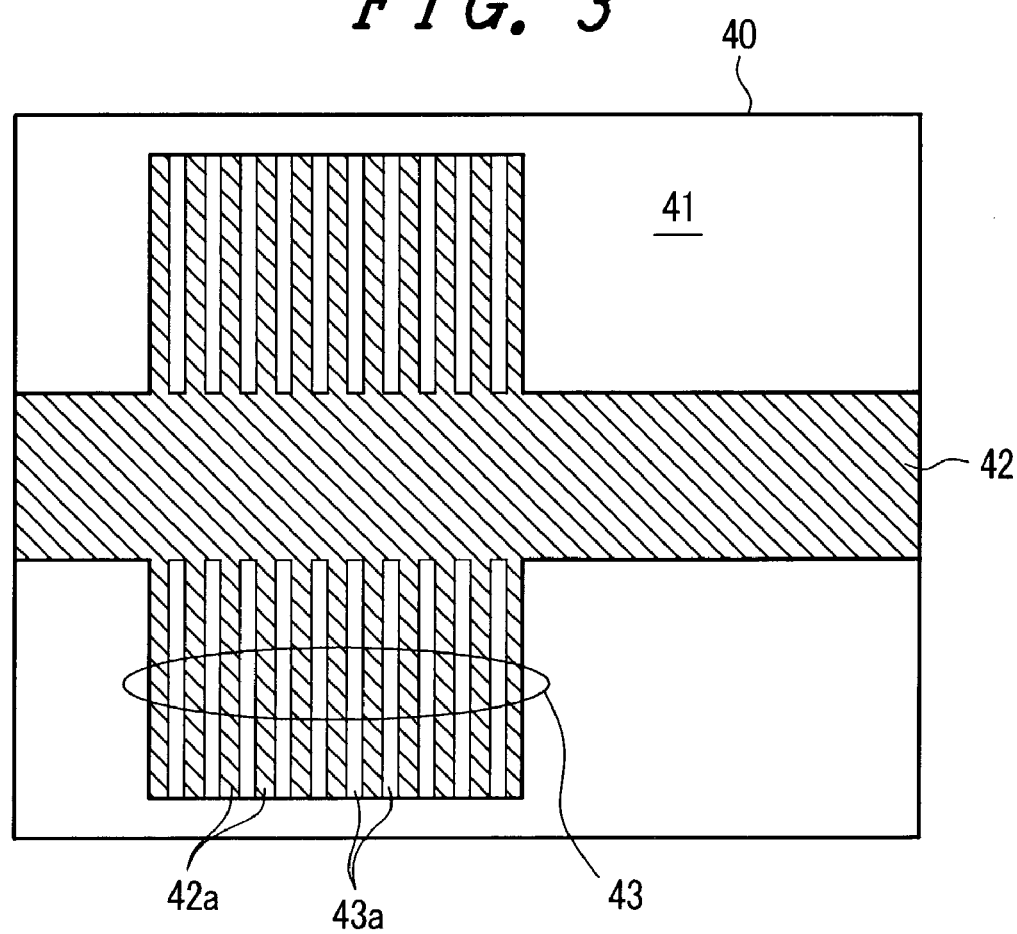
FIG. 3 is a schematic diagram showing the basic constitution of a half exposure mask which is used in the manufacture of the C-MOS p-Si TFT of the present invention.

FIG. 3 is a schematic diagram showing the basic constitution of a half exposure mask of the type used in the manufacture of the C-MOS TFT of the present invention. The half exposure mask 40, which is also referred to as a half tone mask, is preferably made of chromium; and, it is constituted of a light transmitting portion 41, which allows light to completely pass therethrough, an non-light-transmitting portion 42, which completely interrupts light, and a half light transmitting portion 43, which allows light to partially pass therethrough. In this embodiment, the half light transmitting portion 43 is formed of a large number of slits 43a, which are arranged in parallel and interspersed with bridges 42a, which constitute non-light-transmitting portions. In this embodiment, although the slits 43a are formed perpendicular to the non-light-transmitting portion 42, a half exposure mask which forms slits that are parallel to the non-light-transmitting portion 42 can have a similar advantageous effect. Further, the half light transmitting portion 43 can be formed of these continuous slits, circular holes or other openings. Irrespective of the type of openings formed in the half light transmitting portion 43, the opening portions and the non-light transmitting portion are arranged at a level equal to or below a limit of resolution of the exposure light. It is needless to say that the half exposure mask 40 employed by the present invention has a light transmitting portion 41, a non-light transmitting portion 42 and a half light transmitting portion 43, which correspond to a pattern of the C-MOS TFT.

Accordingly, in the half light transmitting portion 43 of the half exposure mask 40 shown in FIG. 3, the arrangement of the parallel slits 43a and the bridges 42a assumes a level equal to or less than a limit of the resolution. With the use of this half exposure mask 40, in the exposure process of the photo step to be described later, a given optical energy is irradiated onto a resist portion that is exposed through the light transmitting portion 41, and the optical energy which is directed below the above-mentioned given optical energy is irradiated to a resist portion exposed through the half light transmitting portion 43. Accordingly, when a negative resist is used, a crosslinking action of the portion that is exposed through the light transmitting portion 41 advances and reaches a lower layer of the resist, while a crosslinking action of the portion exposed through the half light transmitting portion 43 is stopped in the vicinity of the surface. When a positive resist is used, a reverse exposure operation is performed.

Figure 4:
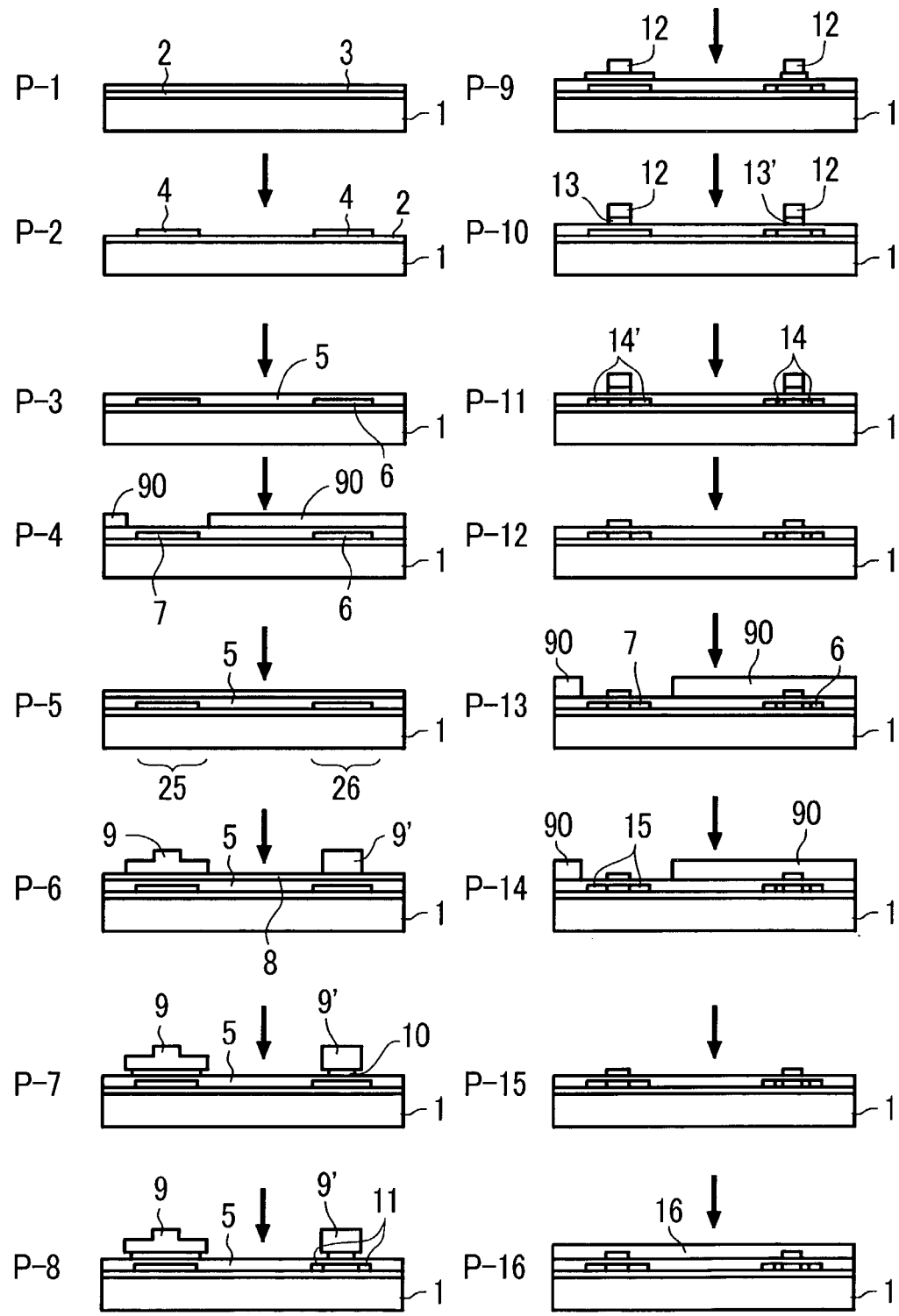
FIG. 4 is a manufacturing process flow diagram showing steps in the manufacture of a C-MOS p-Si TFT according to one embodiment of the present invention.
Figure 5:
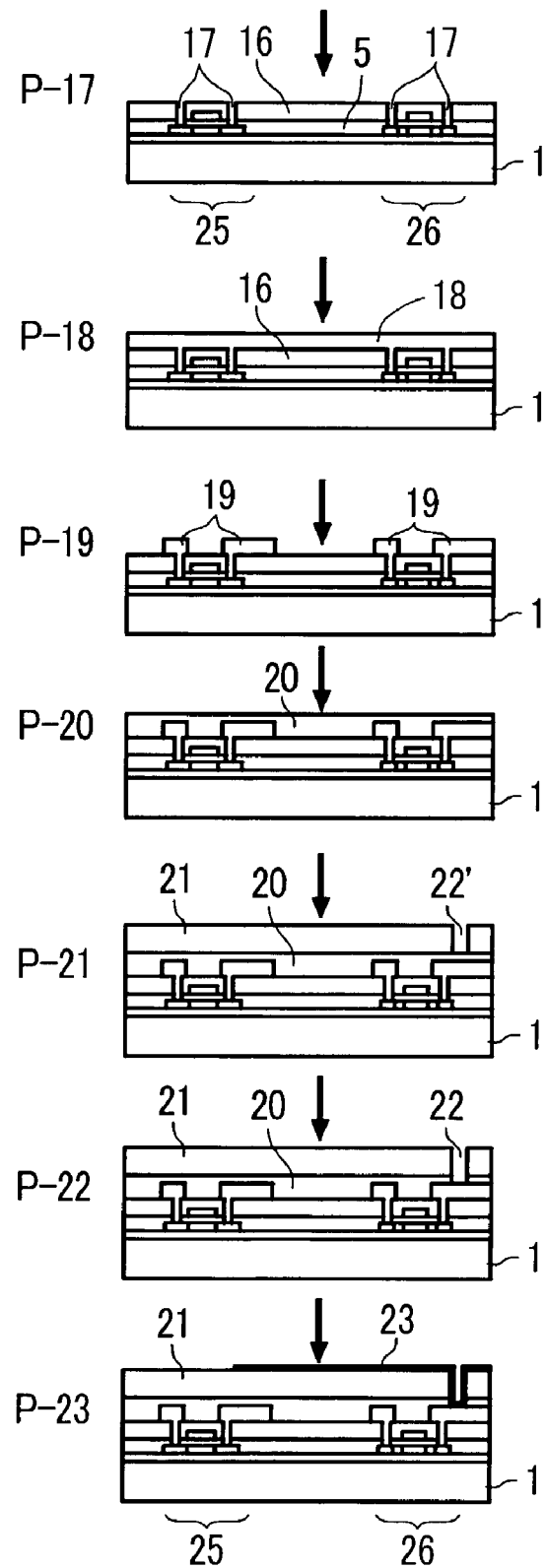
FIG. 5 is a manufacturing process flow diagram showing further steps in the manufacture of the C-MOS p-Si TFT, which follow the steps of FIG. 4, according to the present invention.

FIG. 4 and FIG. 5 are manufacturing process flow diagrams of the steps for production of a C-MOS TFT according to one embodiment of the present invention. These drawings show a cross section of the C-MOS TFT taken along a line B–B' in FIG. 1, in the respective process steps. First of all, an insulation layer 2, formed by laminating silicon oxide (SiO) and silicon nitride (SiN), is formed as a film on a glass substrate 1, and an amorphous silicon (a-Si) layer 3 is formed on the insulation layer 2. Subsequently, by applying dehydrogenation processing and excimer laser annealing (ELA) to the amorphous silicon layer 3, the amorphous silicon layer 3 is formed into polysilicon (p-Si). (Process P-1, hereinafter simply referred to as "P-1".)

After applying a resist, a resist pattern having Si islands is formed by a photolithography step, and, thereafter, Si islands 4 are formed by dry etching. Then, the residual resist is removed. The resist is not shown in the drawing (P-2).

A gate insulation layer 5, that is formed of silicon oxide (SiO), is formed as a film on the Si islands 4 by a CVD method. Then, by performing first ion implantation (E implantation 1 processing) for performing N-type threshold value control, phosphorous (P) is doped into the Si islands 4, thus forming N-MOS Si islands 6 (P-3). Portions other than the P-MOS Si islands portion are covered with a resist 90 by use of a photo step. By performing a second ion implantation (E implantation 2 processing) for performing P-type threshold value control, boron is doped into the P-MOS Si islands portion so that the P-MOS Si islands 7 are formed (P-4).

After removing the resist 90, rapid thermal annealing (RTA) is performed so as to tighten the gate insulation layer 5 by baking, so that the N-MOS Si islands 6 and the P-MOS Si islands 7, whose crystalline state is collapsed due to the E implantation 1 processing and the E implantation 2 processing, are crystallized (P-5).

A gate metal layer 8 formed of molibudenum-20 wt % tungsten alloy (Mo-20 wt % W) is formed as a film by a sputtering method. Then, using the half exposure mask that was described in conjunction with FIG. 3, patterns of half exposure resist 9, 9' are formed by a photolithography method (P-6). Here, a state in which the pattern of the half exposure resist 9, that is exposed through the half light transmitting portion 43, has a thickness that is smaller than the thickness of the resist at the non-light-transmitting portion of the exposure mask, is expressed by a convex shape. That is, shoulder portions of the convex shape constitute the half exposure region where the thickness of the resist is smaller than other portions. Reference symbol 9' indicates the portion having no half exposure region.

Using an etchant formed of an aqueous solution into which phosphoric acid, nitric acid, acetic acid and ammonium fluoride are added, the gate metal layer 8 is etched by wet etching using a shower etching method. Here, side etching is performed in a state wherein a one-side retracting amount of the gate metal layer 8 by etching becomes 0.6 µm to 1.2 µm, thus forming a self-aligned LDD gate electrode 10 (P-7).

The $N^+$ portion 11 is formed by doping phosphorous into the N-MOS Si island 6 by implantation processing of about $3 \times 10^{15}$ cm$^{-2}$ (P-8). Portions disposed at both sides of the N-MOS Si island 6, which are doped with phosphorous, are indicated by reference numeral 11 in such a manner that these portions are defined from the N-MOS Si island 6.

Of the resist 9, the half exposure region, which has a thickness smaller than the thickness of other portion, is removed by ashing so as to form a P channel portion gate electrode resist pattern 12 and an N channel portion gate electrode resist pattern 12' (P-9). In this case, there is a difference in the resist width between the P channel portion gate electrode resist pattern 12 and the N channel portion gate electrode resist pattern 12'. Since the resist ashing is isotropic, the widths of the resists 9, 9' are reduced symmetrically with respect to the center axis of the gate line. Further, the resist 9 has a half exposure region that is different from that of the resist 9', and, hence, the start of reduction or shrinking of the resist width of the resist 9 is delayed. Accordingly, there is a difference in the resist width size symmetrically with respect to the center axis of the gate line between the P channel portion gate electrode resist pattern 12 and the N channel portion gate electrode resist pattern 12'.

Then, using an aqueous solution into which phosphoric acid, nitric acid, acetic acid and ammonium fluoride are added, wet etching is performed so as to form a P channel portion gate electrode 13 and an N channel portion gate electrode 13' (P-10). Here, the wet etching is performed such that the sides of the gate electrode 13' of the N channel portion are not etched. It is also preferable to employ dry etching in place of wet etching so as to reduce the side etching amount to 0.

As described above, there is a difference in the width between the P channel portion gate electrode resist pattern 12 and the N channel portion gate electrode resist pattern 12', and, hence, as shown in the FIG. 1 (top plan view) and FIG. 2, which show the C-MOS element, there is are differences amounting to ΔS between the width of the P channel portion gate electrode 13 and the width of the N channel portion gate electrode 13'. The difference ΔS in resist width is equal on both sides in the width direction of both gate electrodes.

The $N^-$ portion 14 of the N channel is formed by doping phosphorous into the N-MOS Si island 6 by implantation processing of about $3 \times 10^{13}$ cm$^{-2}$. Here, the $N^-$ portion 14' is also simultaneously formed in the P channel region (P-11). Portions which are doped with phosphorous are indicated by reference numerals 14, 14' in such a manner that the portions can be distinguished from the N-MOS Si island 6 and the P-MOS Si island 7. Then, the resist is removed by ashing (P-12).

Portions other than the P-MOS Si island 7 are covered with a resist by a photolithography method (P-13).

The P-MOS Si island 7 is doped with boron (Br) by reverse implantation processing of about $10^{15}$ cm$^{-2}$. Due to this processing, the $N^-$ portion 14 of the P channel region is modified to the $P^+$ portion 15 (P-14). Accordingly, the already doped phosphorus of about $3 \times 10^{13}$ cm$^{-2}$ is present in this $P^+$ portion 15. The boron doped region, which is modified into the P⁺ portion, is indicated by reference numeral 15. The resist 90 is removed by ashing (P-15).

Due to the above-mentioned implantation, the P channel portion 25 has a structure in which the P⁺ polysilicon semiconductor layer and the N⁺ portion are present. Further, due to the above-mentioned implantation, the concentration of doping atoms in the P⁺ polysilicon semiconductor layer, which constitutes the P channel portion, is about $10^{15}$ cm$^{-2}$, and the concentration of N⁻ doping atoms in the N⁻ portion is about $10^{13}$ cm$^{-2}$.

An interlayer insulation film 16, that is formed of SiO, is formed by a CVD method (P-16). Then, the gate insulation layer 5, which is damaged by the implantation processing, is tightened by baking by performing fast annealing (FA) and rapid thermal annealing (RTA) so as to activate the N-MOS Si island 6 and the P-MOS Si island 7.

A resist (not shown in the drawing) is applied such that the resist covers the interlayer insulation layer 16. Resist patterns of contact holes 17 in the N-MOS Si island 6 and the P-MOS Si island 7 are formed by a photolithography method. Thereafter, the interlayer insulation films 16 and 5 are etched by wet etching by use of a shower etching method, using an etchant formed of an aqueous solution to which hydrogen fluoride and ammonium fluoride are added, thus forming the contact holes 17 (P-17). Then, the resist is removed.

Titanium (Ti) which constitutes a barrier against Si, an aluminum-silicon alloy (Al—Si) which constitutes source/drain lines and Ti which constitutes a cap are laminated by a sputtering method so as to form a source/drain layer 18 (P-18).

A resist (not shown in the drawing) is applied such that the resist covers the source/drain layer 18. A resist pattern of source/drain lines is formed by a photolithography method, and, thereafter, the resist pattern is etched by dry etching so as to form drain lines 19 (P-19). Then, the resist is removed.

A passivation layer 20 formed of silicon nitride (SiN) is formed by a CVD method (P-20). Then, the defective level of the inside and an interface of the Si film is terminated by hydrogen annealing.

An acrylic resin containing a photosensitive material is formed as a film on the passivation layer 20 and an organic insulation layer 21, in which a through hole pattern 22' is formed by a photo step, is formed on the passivation layer 20 (P-21).

Using the through hole pattern 22' formed in the organic insulation layer 21 as a mask, the passivation layer 20 is etched by dry etching so as to form a through hole 22 (P-22).

By performing room-temperature film forming by adding a small quantity of water in the atmosphere during sputtering, an amorphous layer ITO is formed as a film such that the amorphous layer ITO covers the organic insulation layer 21. Then, a resist (not shown in the drawing) is applied to the amorphous ITO, and a resist pattern of pixel electrodes is formed by a photo step. Thereafter, using oxalic acid of 3% concentration as an etchant, the amorphous ITO is etched by wet etching, thus forming the pixel-electrode 23 (P-23). Then, the resist is removed.

By adopting this process, it is possible to manufacture the TFT substrate for a liquid crystal panel, for an organic LED or for another panel-type display device, in which the C-MOS circuit is mounted thereon by carrying out the photolithography steps eight times. Hence, the manufacturing cost can be largely reduced. Further, since the N-MOS and P-MOS portions can be formed by the self-aligned process, it is possible to realize a high integration of the C-MOS circuit.

Then, a color filter substrate is laminated to the TFT substrate and liquid crystal material is sealed in a gap defined by the lamination, thus constituting the liquid crystal display device. Further, by applying an organic EL (OLED) material to the pixel electrodes of the TFT substrate and, further, by arranging counter electrodes on the organic EL (OLED) material, an organic LED display device is constituted. The TFT substrate of the present invention is applicable to a TFT substrate of an active matrix type display device of another type in the same manner.

Here, when the N-MOS and P-MOS portions are formed by exposure mask alignment, as will be explained later in conjunction with the conventional process of manufacture of a C-MOS TFT, or as explained previously in conjunction with FIG. 9, a mating portion 35 which takes the mask displacement into account is necessary, and, hence, the high integration is difficult. By adopting the half exposure mask of this embodiment and the self-aligned C-MOS-process explained in conjunction with FIG. 4 and FIG. 5, it is possible to mount the highly integrated peripheral circuits on a glass substrate having a large area; and, hence, a low-temperature polysilicon TFT panel having, a large screen and exhibiting high definition and rapid driving, on which a shift register, a DA converter circuit, a logic circuit and the like are highly integrated, can be manufactured.

Figure 6:
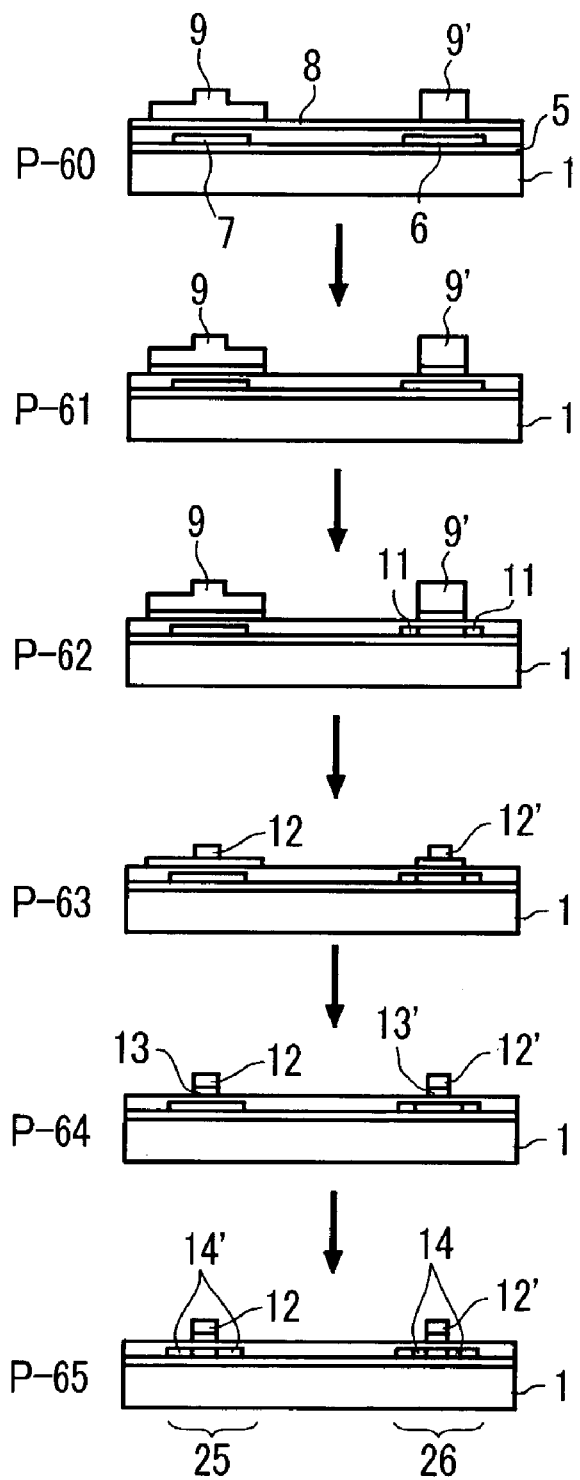
FIG. 6 is a manufacturing process flow diagram showing steps in the manufacture of a C-MOS p-Si TFT according to another embodiment of the present invention.

FIG. 6 is a manufacturing process flow diagram of a process of production of a C-MOS TFT according to another embodiment of the present invention. Also, in this embodiment, FIG. 6 shows a C-MOS cross section taken along a line B–B' in FIG. 1, in respective process steps. In FIG. 6, only the constitutional features of this embodiment are shown. The processes of this embodiment ranging from (P-1) to (P-6) in FIG. 4, that is, the processes in which the gate metal layer 8 is formed and patterns of half exposure resists 9, 9' are formed using the half exposure mask shown in FIG. 3 correspond to those of the previous embodiment.

After forming the patterns of half exposure resists 9, 9' (P-60), the gate metal layer 8 is etched by dry etching (P-61). The N⁺ portion 11 is formed by doping phosphorous into the N-MOS Si island 6 by implantation processing of about $3\times10^{15}$ cm$^{-2}$ (P-62).

Thereafter, the remaining resists 9, 9' are removed by ashing so as to form a P channel portion gate electrode resist pattern 12 and an N channel portion gate electrode resist pattern 12' (P-63). In this case, a difference in resist width arises between the P channel portion gate electrode resist pattern 12 and the N channel portion gate electrode resist pattern 12'. Although the size difference depends on the ashing amount and the film thickness of a half exposure portion resist film (portion of the resist 9 having a small thickness), this embodiment is characterized in that the size difference is present symmetrically with respect to the center axis of the line of the gate electrode (size changes ΔS shown in FIG. 2 being equal). To the contrary, with respect to the mask alignment in the conventional process, it is uncertain how the size differences are displaced, and, hence, there is no assurance that the displacement of the width sizes adopts a line symmetry.

A P channel portion gate electrode 13 and an N channel portion gate electrode 13' are formed by dry etching (P-64). Difference in width size exist between the P channel portion gate electrode resist pattern 12 and the N channel portion gate electrode resist pattern 12', and, hence, as shown in FIG. 1 (top plan view), which shows the C-MOS element, a difference arises between the width of the P channel portion gate electrode 13 and the width of the N channel portion gate electrode 13' (see FIG. 2). The method which comes thereafter, starting from the formation of an N⁻ portion 14 of an N channel and a N⁻ portion 14' of a P channel (P-65), is substantially the same as the method which has been explained in conjunction with step (P-11) in FIG. 4 to step (P-23) in FIG. 5 concerning the embodiment 1.

In this embodiment, the step of retracting the resist for forming the LDD and the step of forming the resist of the gate electrodes of the P channel TFT by removing the resist of the half exposure portions are the same step. Accordingly, it is important to form the half exposure resist having a film thickness corresponding to a required LDD width.

Also, in this embodiment, it is possible to mount the highly integrated peripheral circuits on a glass substrate having a large area, and, hence, a low-temperature polysilicon TFT panel having a large screen and exhibiting high definition and rapid driving, on which a shift register, a DA converter circuit, a logic circuit and the like are highly integrated, can be manufactured.

Now, to clarify the difference between the present invention and the prior art, the manufacturing process used for production of the C-MOS p-Si TFT according to the prior art will be explained.

Figure 7:
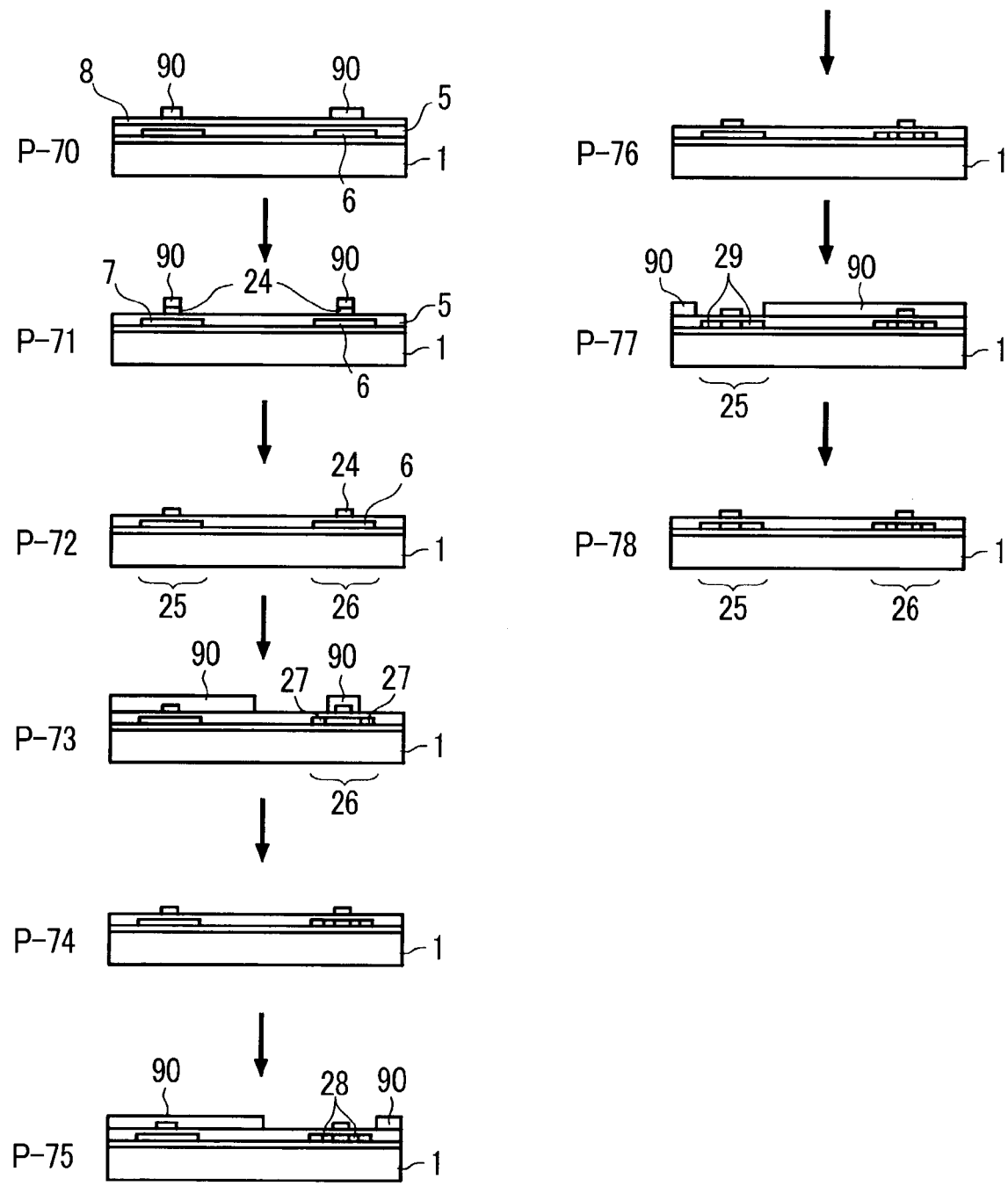
FIG. 7 is a manufacturing process flow diagram showing step in the manufacture of a C-MOS p-Si TFT representing one example of the prior art.

FIG. 7 is a manufacturing process flow diagram showing steps in the production of the C-MOS p-Si TFT of the prior art. Here, the respective processes are shown as a cross section of the C-MOS. Processes up to the formation of the gate metal layer 8 are substantially the same as the processes employed for the embodiment of the present invention which has been explained in conjunction with FIG. 4, and, hence, the processes which come thereafter will be explained in detail.

A pattern of a resist 90 for gate metal electrodes is formed by a photo step (P-70), and the gate metal layer 8 is etched by wet etching or dry etching so as to form gate electrodes 24 (P-71).

The patterned resist out of the resist 90 is removed by peeling using an organic alkali or by ashing (P-72).

Portions other than an N⁺ portion 27 are covered with the resist 90 by a photolithography method. Then, the N⁺ portion 27 is formed by doping phosphorous into the N-MOS Si island 6 by implantation processing of about $3 \times 10^{15}$ cm⁻² (P-73). The resist 90 is removed (P-74).

Portions other than an N channel portion 26 are covered with the resist 90 by a photolithography method. Then, the N⁻ portion 28 is formed by doping phosphorous into the N-MOS Si island 6 by implantation processing of about $3 \times 10^{13}$ cm⁻₂ (P-75). The resist 90 is removed (P-76).

Portions other than a P channel portion 25 are covered with the resist 90 by a photolithography method. Then, the P⁺ portion 29 is formed by doping boron into the P-MOS Si island 7 by implantation processing of about $3 \times 10^{15}$ cm⁻² (P-77). The resist 90 is removed (P-78). The method which comes thereafter starting from the formation of an interlayer insulation film is substantially the same as the method which has been explained in conjunction with FIG. 4.

When the C-MOS p-Si TFT is manufactured by this method, it is necessary to perform the photolithography steps ten times, and, hence, the manufacturing cost is increased.

Figure 8:
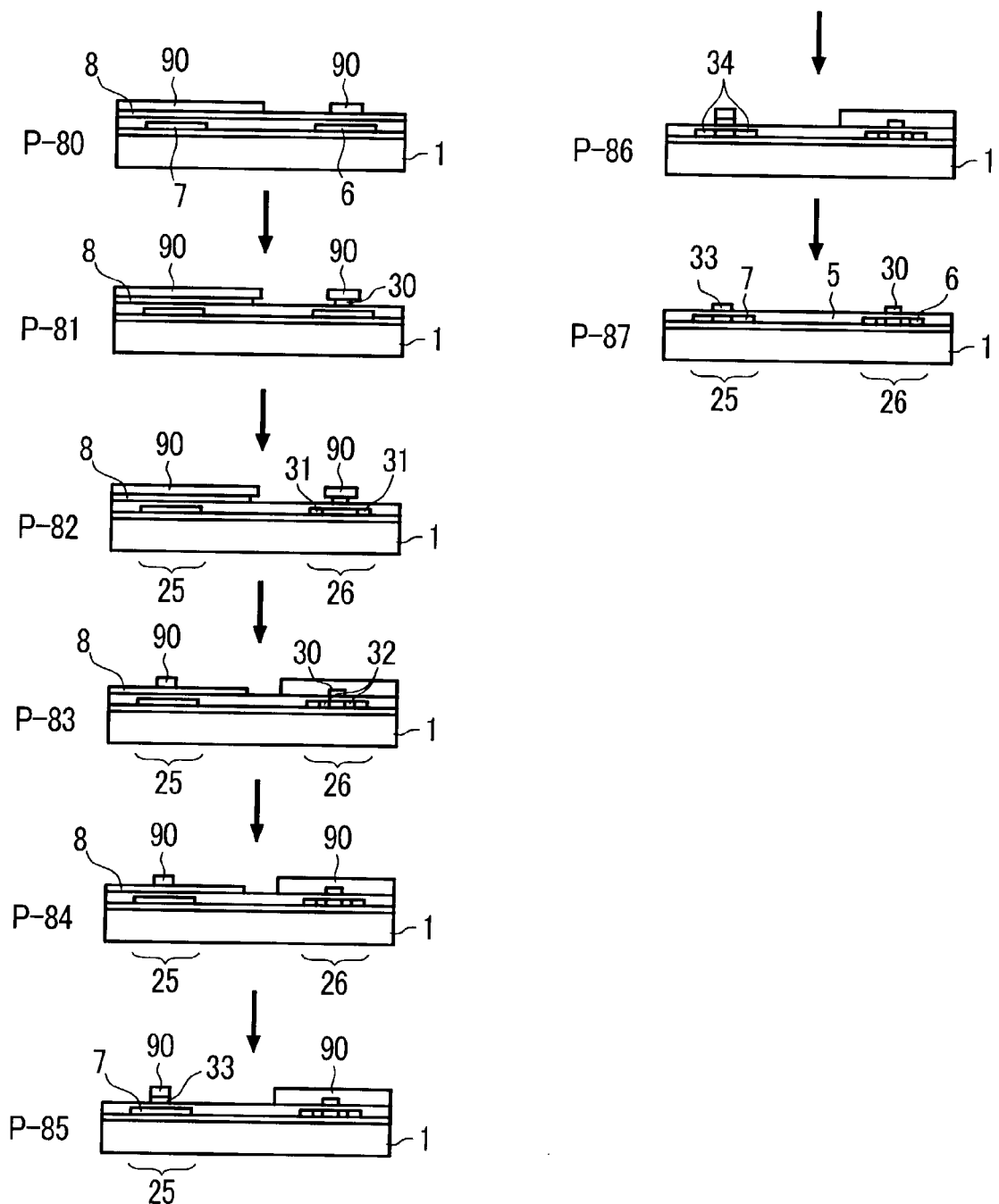
FIG. 8 is a manufacturing process flow diagram showing steps in the manufacture of a C-MOS p-Si TFT by a self-aligned LDD according to another embodiment of the prior art.
Figure 9:
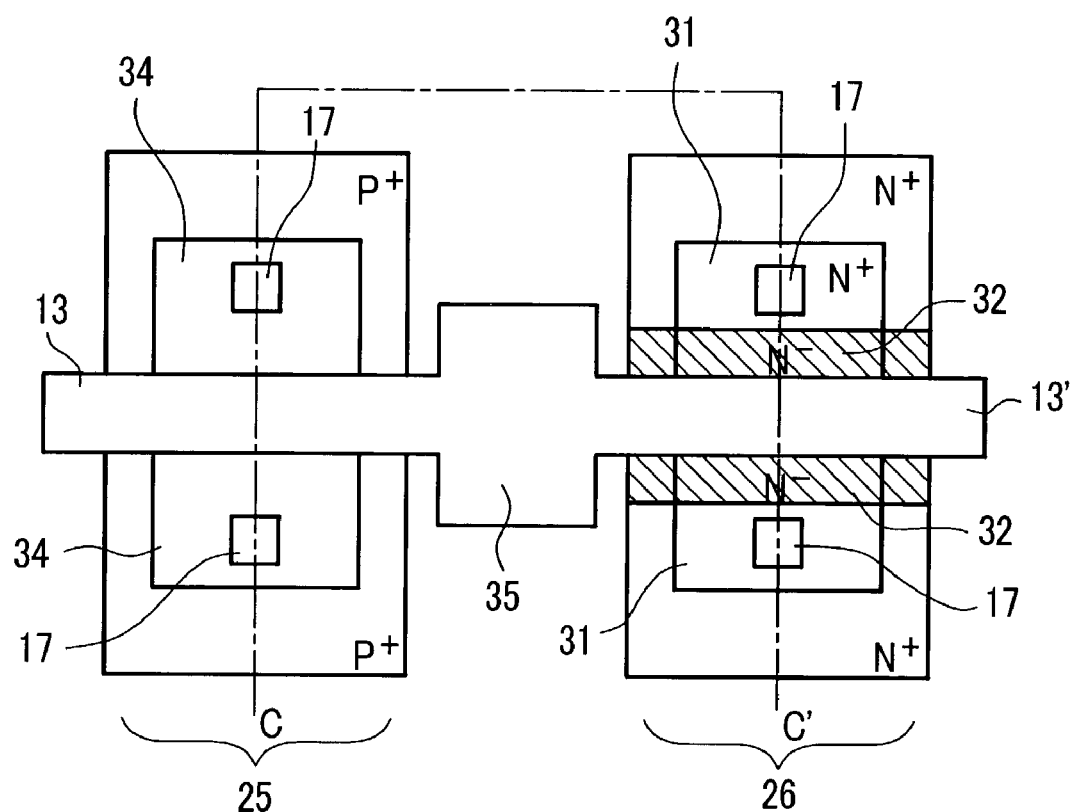
FIG. 9 is a top plan view schematically showing the constitution of one example of a conventional C-MOS p-Si TFT element provided in a display device.

FIG. 8 is a manufacturing process flow diagram showing steps in the production of a C-MOS p-Si TFT, as shown in FIG. 9, which adopts the self-aligned LDD construction, for explaining the another example of the prior art. Here, the respective processes are shown as a C-MOS cross section taken along a line C–C' in FIG. 9. Processes up to the film formation of the gate metal layer 8 are substantially the same as those of the embodiment of the present invention which have been explained in conjunction with FIG. 4, and, hence, processes which come after the film formation of the gate metal layer 8 will be explained in detail hereinafter.

After forming the gate metal layer 8, a pattern of a resist 90 for a self-aligned LOD is formed by a photolithography step (P-80). Using an etchant formed of an aqueous solution into which phosphoric acid, nitric acid, acetic acid and ammonium fluoride are added, the gate metal layer 8 is etched by wet etching using a shower etching method. Here, side etching is performed in a state in which a one-side retracting amount of the gate metal layer 8 by etching becomes 0.6 μm to 1.2 μm, thus forming a self-aligned LDD gate electrode 30 (P-81).

Using this resist 90 as a mask, an N⁺ portion 31 is formed by doping phosphorous into an N-MOS Si island 6 by implantation processing of about $3 \times 10^{15}$ cm⁻² (P-82). The resist 90 is removed.

Using the self-aligned LDD gate line 30 as a mask, an N⁻ portion 32 is formed by doping phosphorous into an N-MOS Si island 6 by implantation processing of about $3 \times 10^{13}$ cm⁻² (P-83).

Portions of the P channel portion 25, which constitute the gate electrodes of the gate metal layer 8, and portions of the N channel portion 26 are covered with the resist 90 by the photolithography method (P-84).

The gate metal layer 8 of the P channel portion 25 is etched by dry etching, thus forming the P channel portion gate electrode 33 (P-85).

The P-MOS Si island 7 is doped with boron by implantation processing of about $10^{15}$ cm⁻², thus forming a P⁺ portion 34 (P-86). The resist 90 is removed (P-87).

The method which comes thereafter, starting from the formation of an interlayer insulation film, is substantially the same as the method which has been explained in conjunction with FIG. 4, concerning an embodiment of the present invention.

When the C-MOS TFT is manufactured by this method, the gate electrode 13 of the P channel portion 25 and the gate electrode 13' of the N channel portion 26 are formed by separate photo steps, and, hence, it is necessary for the gate electrodes 13 and 13' to have mating portions at a connection portion between the P channel portion 25 and the N channel portion 26, as shown in FIG. 9. Accordingly, it should be appreciated that high integration of the C-MOS circuit is difficult to attain by this method.

Here, by laminating a color filter substrate on which, for example, color filters, common electrodes and the like are formed as a counter substrate to the thin film transistor substrate, on which the driving circuits and the active elements which use the above-mentioned C-MOS thin film transistors are formed, and by sealing liquid crystal material in a gap defined between opposing substrates, it is possible to constitute a liquid crystal display device. Further, by laminating organic EL layers on regions of pixel electrodes provided to active elements formed on the thin film transistor substrate and by laminating other electrodes such that the organic EL layers are sandwiched by electrodes, it is possible to constitute an organic EL display device.

It is needless to say that the present invention is not limited to the above-mentioned embodiments, and that various modifications are conceivable within the scope of the technical concept of the present invention. For example, although the semiconductor layers are formed of polysilicon in this specification, semiconductors may be formed of single crystal or of pseudo single crystal having properties between properties of the single crystal and properties of the polysilicon. Further, although the LDD structure is formed only in the N type transistor region in the example described in this specification, the LDD structure may be configured to be formed on the P type transistor region.

Further, as shown in FIG. 1 and FIG. 2, the C-MOS thin film transistor is formed on the substrate of the display device, and the C-MOS thin film transistor is configured such that the gate electrode of the P channel portion and the gate electrode of the N channel portion are connected on a substantially straight line and the P channel portion and the N channel portion are arranged close to each other. Accordingly, it is possible to manufacture a space-saving C-MOS TFT which can eliminate the aligning portion, such as the one shown in FIG. 9, so that high integration of the C-MOS TFTs can be realized. It is needless to say that even with such a constitution, the gate electrode width of the P channel portion and the gate electrode width of the N channel portion differ from each other. Further, the connection at the connection portion between the gate electrode of the P channel portion and the gate electrode of the N channel portion is established with a width which is equal to or greater than the narrower gate electrode width out of the gate electrode width of the P channel portion and the gate electrode width of the N channel portion, or is equal to or less than the broader gate electrode width out of the gate electrode width of the P channel portion and the gate electrode width of the N channel portion. In the drawings of the embodiments, the gate electrode width of the P channel portion is set to be broader than the gate electrode width of the N channel portion. Further, the gate electrode of the P channel portion and the gate electrode of the N channel portion of the C-MOS thin film transistor have equal differences with respect to the gate line width of the connection portion in the widthwise direction.

Further, although the constitution of the C-MOS p-Si TFT has been described in this specification, the C-MOS TFT is not limited to C-MOS p-Si TFT. This merely implies that, since a C-MOS p-Si TFT is advantageous from the point of view of high definition and fast operation, the use of the C-MOS p-Si TFT is preferable.

As has been described heretofore, according to the present invention, by adopting the self-aligned C-MOS process which uses a half tone mask as the exposure mask for manufacturing the C-MOS mounted on the display device, the positioning no longer becomes necessary at the bonding portion between the P-MOS TFT and the N-MOS TFT, and, hence, it is possible to achieve high integration with the least number of photo steps, whereby a display device which exhibits high definition and rapid driving can be realized.

What is claimed is:

1. A display device including a C-MOS thin film transistor on a substrate,
wherein a width of a gate electrode of a P channel portion is substantially constant throughout the P-channel portion and a width of a gate electrode of an N channel portion is substantially constant throughout the N-channel portion in said C-MOS thin film transistor,
wherein said width of a gate electrode of a P channel portion and said width of a gate electrode of an N channel portion in said C-MOS thin film transistor are different from each other, wherein said gate electrode of the P channel portion and said gate electrode of the N channel portion are connected such that a longitudinal axis of the P channel portion and a longitudinal axis of the N channel portion lie on a substantially straight line, and wherein said gate electrode widths extend in a direction transverse to the longitudinal axes of the P channel portion and the N channel portion.

2. A display device according to claim 1, wherein said width of the gate electrode of the P channel portion is broader than said width of the gate electrode of the N channel portion.

3. A display device according to claim 1, wherein said C-MOS thin film transistor is a C-MOS polysilicon thin film transistor.

4. A display-device according to claim 1, wherein said gate electrode of the P channel portion and said gate electrode of the N channel portion in said C-MOS thin film transistor have equal differences in a gate line width at a connection portion in the widthwise direction.

5. A display device according to claim 1, wherein a $P^+$ semiconductor region and an $N^-$ doping region are present in the P channel portion.

6. A display device including a C-MOS thin film transistor on a substrate,
wherein a width of a gate electrode of a P channel portion and a width of a gate electrode of an N channel portion in said C-MOS thin film transistor are different from each other,
wherein a $P^+$ semiconductor region and an $N^-$ doping region are present in the P channel portion,
wherein the concentration of p+ doping atoms in said $P^+$ semiconductor region which constitutes said P channel portion is about $10^{15}$ cm$^{-2}$ and the concentration of $N^-$ doping atoms in said $N^-$ doping region is about $10^{13}$ cm$^{-2}$ and
wherein said gate electrode of the P channel portion and said gate electrode of the N channel portion are connected such that a longitudinal axis of the P-channel portion and a longitudinal axis of the N-channel portion lie on a substantially straight line, and wherein said gate electrode widths extend in a direction transverse to the longitudinal axes of the P-channel portion and the N-channel portion.

7. A display device including a C-MOS thin film transistor on a substrate,
wherein a width of a gate electrode of a P channel portion and a width of a gate electrode of an N channel portion is said C-MOS thin film transistor are different from each other, wherein a $P^+$ semiconductor region which constitutes said P channel portion includes $N^-$ doping atoms as impurities, and
wherein said gate electrode of the P channel portion and said gate electrode of the N channel portion are connected such that a longitudinal axis of the P-channel portion and a longitudinal axis of the N-channel portion lie on a substantially straight line, and wherein said gate electrode widths extend in a direction transverse to the longitudinal axes of the P-channel portion and the N-channel portion.

8. A display device comprising:
a C-MOS thin film transistor formed on a substrate of a display device,
wherein said C-MOS thin film transistor is comprised of a P-MOS thin film transistor and an N-MOS thin film transistor,
wherein said P-MOS thin film transistor and said N-MOS thin film transistor are connected by a gate electrode, formed in both the P-MOS thin film transistor and the N-MOS thin film transistor, on a substantially straight line,
wherein a width of a gate electrode of a P-MOS thin film transistor is substantially constant throughout the P-MOS thin film transistor and a width of a gate electrode of an N-MOS thin film transistor is substantially constant throughout the N-MOS thin film transistor in said C-MOS thin film transistor wherein said width of a first portion of the gate electrode in said P-MOS thin film transistor and said width of a second portion of the gate electrode of said N-MOS thin film transistor are different from each other, wherein a connection portion is provided between the first portion and the second portion of the gate electrode, which connection portion includes a transitional region in which the width of the gate electrode changes from a broader width of one of the first and second portions of the gate electrode to a narrower width of the other of the first and second portions of the gate electrode, and wherein said gate electrode of the P channel portion and said gate electrode of the N channel portion are connected such that a longitudinal axis of the P-channel portion and a longitudinal axis of the N-channel portion lie on a substantially straight line, and wherein said gate electrode widths extend in a direction transverse to the longitudinal axes of the P-channel portion and the N-channel portion.

9. A display device according to claim 8, wherein the width of the first portion of the gate electrode in said P-MOS thin film transistor is broader than the width of the second portion of the gate electrode in said N-MOS thin film transistor.

10. A display device comprising:

a C-MOS thin film transistor formed on a substrate of a display device, wherein a gate electrode of a P channel portion and a gate electrode of an N channel portion are connected on a substantially straight line in said C-MOS thin film transistor, wherein said P channel portion and said N channel portion are configured to be adjacent to each other, wherein a width of a gate electrode of a P channel portion is substantially constant throughout said P-channel portion and a width of a gate electrode of an N channel portion is substantially constant throughout said N-channel portion in said C-MOS thin film transistor, wherein said width of the gate electrode of said P channel portion and said width of the gate electrode of said N channel portion are different from each other, and wherein said gate electrode of the P channel portion and said gate electrode of the N channel portion are connected such that a longitudinal axis of the P-channel portion and a longitudinal axis of the N-channel portion lie on a substantially straight line, and wherein said gate electrode widths extend in a direction transverse to the longitudinal axes of the P-channel portion and the N-channel portion.

11. A display device according to claim 10 wherein a connection portion is provided between the gate electrode of the P channel portion and the gate electrode of the N channel portion, which connection portion includes a transitional region in which a width of the connection portion changes from a broader width of one of the gate electrodes of the P channel portion and the N channel portion to a narrower width of the other of the gate electrodes of the P channel portion and the N channel portion.

12. A display device according to claim 11, wherein the width of the gate electrode of said P channel portion is broader than the width of the gate electrode of said N channel portion.

13. A display device according to claim 12, wherein the gate electrode of said P channel portion and the gate electrode of said N channel portion in said C-MOS thin film transistor have equal differences in a gate line width at said connection portion in the widthwise direction.

14. A display device according to claim 10, wherein a $P^+$ semiconductor region and an $N^-$ doping region are present in the P channel portion.

15. A display device comprising:

a C-MOS thin film transistor formed on a substrate of a display device, wherein a gate electrode of a P channel portion and a gate electrode of an N channel portion are connected on a substantially straight line in said C-MOS thin film transistor, wherein said P channel portion and said N channel portion are configured to be adjacent to each other, and wherein a width of the gate electrode of said P channel portion and a width of the gate electrode of said N channel portion are different from each other, wherein a $P^+$ semiconductor region and an $N^-$ doping region are present in the P channel portion, wherein the concentration of $P^+$ doping atoms in said $P^+$ semiconductor region which constitutes said P channel portion is about $10^{15}$ cm$^{-2}$ and the concentration of $N^-$ doping atoms in said $N^-$ doping region is about $10^{13}$ cm$^{-2}$, and wherein said gate electrode of the P channel portion and said gate electrode of the N channel portion are connected such that a longitudinal axis of the P-channel portion and a longitudinal axis of the N-channel portion lie on a substantially straight line, and wherein said gate electrode widths extend in a direction transverse to the longitudinal axes of the P-channel portion and the N-channel portion.

16. A display device comprising:

a C-MOS thin film transistor formed on a substrate of a display device, wherein a gate electrode of a P channel portion and a gate electrode of an N channel portion are connected on a substantially straight line in said C-MOS thin film transistor, wherein said P channel portion and said N channel portion are configured to be adjacent to each other, and wherein a width of the gate electrode of said P channel portion and a width of the gate electrode of said N channel portion are different from each other, wherein a $P^+$ semiconductor region which constitutes said P channel portion includes $N^-$ doping atoms as impurities, and wherein said gate electrode of the P channel portion and said gate electrode of the N channel portion are connected such that a longitudinal axis of the P-channel portion and a longitudinal axis of the N-channel portion lie on a substantially straight line, and wherein said gate electrode widths extend in a direction transverse to the longitudinal axes of the P-channel portion and the N-channel portion.

17. A display device according to claim 10, wherein said C-MOS thin film transistor is a C-MOS polysilicon thin film transistor.

* * * * *